United States Patent
Kowalski

(10) Patent No.: US 6,513,991 B1
(45) Date of Patent: Feb. 4, 2003

(54) SEMICONDUCTOR OPTICAL DEVICE PACKAGE

(75) Inventor: Vincent T. Kowalski, Wyomissing, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/493,749

(22) Filed: Jan. 28, 2000

(51) Int. Cl.[7] .................................................. G02B 6/42
(52) U.S. Cl. ........................................... 385/92; 385/93
(58) Field of Search ............................ 385/92, 93, 94, 385/88, 89, 24; 359/341.1–341.3

(56) References Cited

U.S. PATENT DOCUMENTS

| | | | | |
|---|---|---|---|---|
| 4,456,329 A | * | 6/1984 | Henderson et al. | |
| 4,995,696 A | * | 2/1991 | Nishimura et al. | |
| 4,997,252 A | * | 3/1991 | Sugawara et al. | |
| 5,181,264 A | * | 1/1993 | Chiaretti et al. | 385/33 |
| 5,479,547 A | * | 12/1995 | Kunikane et al. | 385/47 |
| 5,555,330 A | * | 9/1996 | Pan et al. | 385/39 |
| 5,661,835 A | * | 8/1997 | Kato et al. | 385/92 |
| 5,845,030 A | * | 12/1998 | Sasaki et al. | 385/88 |
| 5,881,193 A | | 3/1999 | Anigbo et al. | 385/93 |
| 5,889,904 A | | 3/1999 | Pan et al. | 385/24 |
| 6,053,640 A | * | 4/2000 | Miyokawa et al. | 385/88 |

* cited by examiner

Primary Examiner—Hemang Sanghavi
Assistant Examiner—Michael J. Stahl

(57) ABSTRACT

The invention is an optical device package which includes a housing defining an enclosure and including an exterior wall. An optical device is mounted within the enclosure. An assembly including a wavelength division multiplexer element is attached to the exterior wall so that the multiplexer element receives light from the optical device. An optical fiber termination including at least one optical fiber is attached to the assembly so that the fiber receives light from the multiplexer element.

19 Claims, 2 Drawing Sheets

SEMICONDUCTOR OPTICAL DEVICE PACKAGE

FIELD OF THE INVENTION

This invention relates to semiconductor optical devices, and in particular to a package which incorporates lasers and other components, a network including such a package, and a method of fabricating a package.

BACKGROUND OF THE INVENTION

Optical networks are the subject of increasing interest in telecommunications due to their immense information handling capacity. Key components of such networks include one or more semiconductor lasers for generating an optical signal, and impurity-doped fiber amplifiers for amplification of the optical signal. A pump laser is coupled to the fiber amplifier through a wavelength division multiplexer (WDM) to excite the impurities, e.g., erbium, in the fiber amplifier in order to amplify the signal.

In present systems, the pump laser is usually fusion spliced to the wavelength division multiplexer, thus contributing to the cost of assembling the components of the system. It would be simpler and more economical to provide the pump laser and the WDM in a single package. It has been suggested to incorporate a pump laser in a package with isolators and filter elements. However, the inclusion of such elements in a package may be difficult to manufacture.

It is desirable, therefore, to integrate the pump laser and WDM element in such a way as to provide cost effectiveness and ease of manufacture.

SUMMARY OF THE INVENTION

The invention in one aspect is an optical device package which includes a housing defining an enclosure and including an exterior wall. An optical device is mounted within the enclosure. An assembly including a wavelength division multiplexer element is attached to the exterior wall so that the multiplexer element receives light from the optical device. An optical fiber termination including at least one optical fiber may be attached to the assembly so that the fiber receives light from the multiplexer element.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
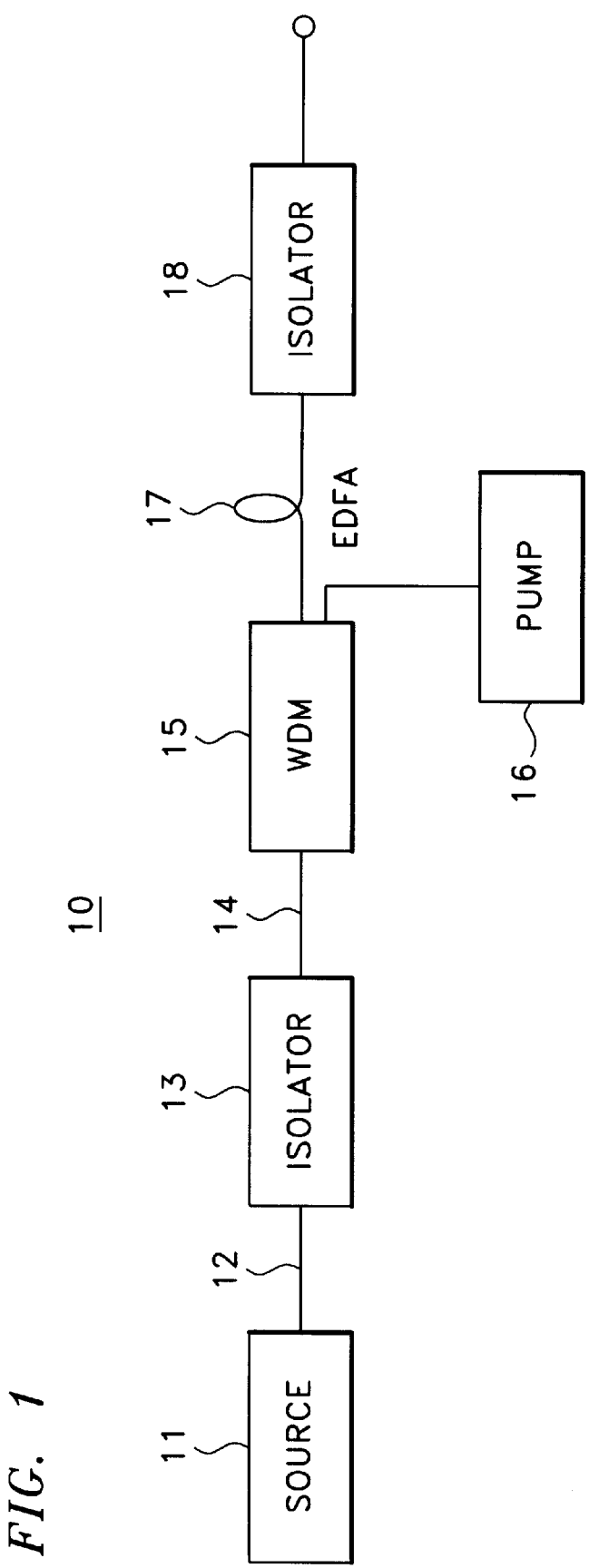
FIG. 1 is a schematic diagram of a portion of an optical network including the package according to an embodiment of the invention.

FIG. 1 illustrates in block form a portion of a typical optical network, 10, which can utilize the present invention. The light signal is generated by a source, 11, which is typically a laser such as an electroabsorption modulated laser (EML) which generates light having an exemplary wavelength of approx. 1550 nm. The signal propagates through an optical fiber, 12, to an optical isolator, 13, which prevents reflection of the light signal back to the source, 11. The light signal continues to propagate through an optical fiber, 14, to a wavelength division multiplexer element (WDM), 15, which is designed to combine the signal light with light from a pump laser, 16. The WDM element is typically a high pass or low pass optical filter. The pump laser typically generates light with a wavelength of 980 nm or 1480 nm. The combined signal and pump light is coupled to a fiber amplifier, 17, such as an erbium doped fiber amplifier (EDFA), which amplifies the signal as a result of the pump light exciting the dopants in the fiber amplifier. The amplified signal light is coupled through a second isolator, 18, which, again, is designed to prevent backward reflection, and sent on to other portions of the network. While this example shows a pump laser, 16, coupled to propagate light through the amplifier, 17, in the same direction as the signal light, (co-propagating) the pump could be coupled so that the pump light propagates in a direction opposite to the signal light (counter-propagating).

Figure 2:
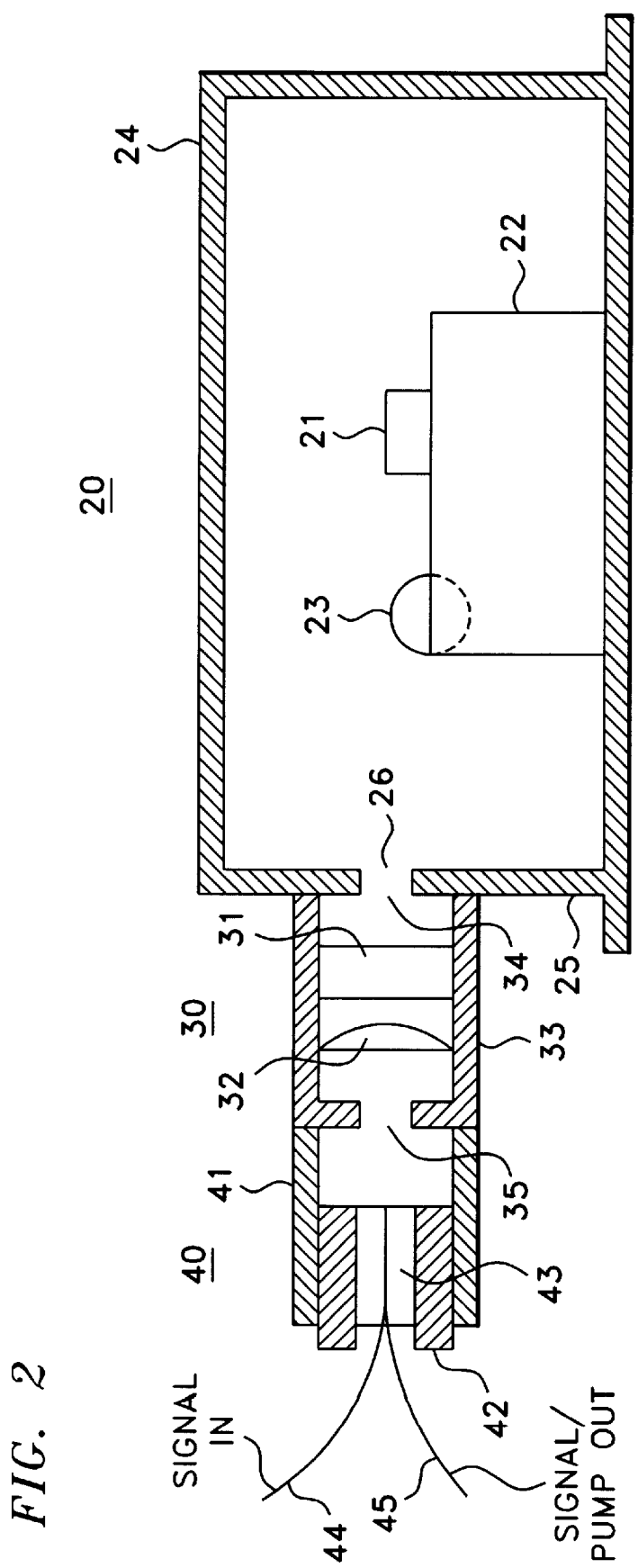
FIG. 2 is a cross sectional view of a package in accordance with an embodiment of the invention.

FIG. 2 illustrates an optical device package, 20, in accordance with an embodiment of the invention. An optical device, 21, such as a semiconductor pump laser, or another type of semiconductor laser, or a light emitting device, is exemplarily mounted on a major surface of a substrate, 22, which is typically a silicon substrate. Preferably mounted within a groove in the surface of the substrate is a spherical lens, 23, for collimating the light emitted by the laser, 21. It will be appreciated that the substrate may also include many other elements, such as conductors, backface monitors and the like, which are not shown for purposes of simplicity. (For a more detailed discussion of an optical subassembly, see U.S. Pat. No. 5,881,193 issued to Anigbo et al, which is incorporated by reference herein.)

The substrate, 22, including the laser and lens is mounted within an enclosure, 24, which is typically made of an iron-nickel-cobalt alloy. While the substrate is shown mounted to the bottom of the enclosure in this example, it will be appreciated that it can be mounted to a pedestal or to the side walls of the enclosure. The enclosure, 24, includes a front wall, 25, with an aperture window, 26, formed therein. The laser, 21, and lens, 23, are aligned so that light from the laser is transmitted through the aperture, 26, when the laser is biased.

An assembly, 30, preferably includes a WDM element, 31, another lens, 32, and a lens holder, 33, in which the WDM element and lens are mounted. In this example, the lens holder, 33, is a cylindrical tube made of a metal such as stainless steel so that the element, 31 and lens 32 may be epoxied to the inner wall of the tube. The tube includes openings, 34 and 35, on either end. The WDM element, 31, can be a typical multiplexing element made of a glass coated with a material which will transmit certain wavelengths and reflect certain other wavelengths as described in more detail below. The lens, 32, in this example, is an aspheric lens which is designed to focus light onto a fiber to be described.

The assembly, 30, is mounted to the front wall, 25, of the enclosure, 24, so that the opening, 34, is aligned with the aperture window, 26, in the wall of the enclosure, 24. This can be done, for example, by welding the holder to the wall.

An optical fiber termination, 40, is mounted to the end of the lens holder, 33, which includes the opening, 35, i.e. to the end of the tube which is remote from the enclosure, 24. The termination preferably includes a sleeve, 41, which is made of a metal such as stainless steel. The sleeve, 41, preferably has inserted therein a ferrule, 42, which is secured to the inner wall of the sleeve by laser welding. The ferrule is typically a metal such as stainless steel. Preferably inserted within the ferrule is a capillary, 43, which is usually made of ceramic and is secured to the ferrule by a press fit. Embedded within the capillary is at least one optical fiber. In this example, two fibers, 44 and 45, are embedded within the capillary by known techniques. The termination, 40, is mounted to the lens holder, 33 so that light from the input fiber, 44, is incident on the WDM element, 31, through the opening, 35, and the output fiber, 45, can receive light from the laser, 21, as well as reflected light from the WDM element, 31.

In operation, as presently understood, the light signal from source, 11, would propagate through fiber, 44, of the package. The WDM element, 31, is coated so as to reflect at least a major portion of the wavelength of the signal light (e.g., 1550 nm), and the assembly, 30, and termination, 40, are aligned so that the signal light is reflected back to the output fiber, 45. In the meantime, light from the laser, 21, has a wavelength (e.g., 980 or 1480 nm) which is substantially transmitted through the WDM element, 31, and is also incident on the output fiber, 45 due to the alignment of the laser, 21, assembly, 30, and the termination 40. Thus, the device, 20, integrates the WDM and pump components, 15 and 16 (FIG. 1), into a single package.

The device package, 20, can be assembled by various techniques. One possibility is to send light through the input fiber, 44, and measure the reflection from the WDM element to the output fiber, 45. When sufficient light is reflected, the termination could be welded to the lens holder, 33. Then, the combination of termination, 40, and assembly, 30, could be aligned with the laser 21 while the laser is emitting light. When sufficient light propagates in the output fiber, 45, the lens holder, 33, can be welded to the wall, 25, of the enclosure.

What is claimed is:

1. An optical device package comprising:
   a housing defining an enclosure and including an exterior wall;
   an optical device mounted within the enclosure; and
   an assembly including a wavelength division multiplexer element attached to the exterior wall so that the multiplexer element receives both an optical input signal from an external optical source and light from the optical device mounted within the enclosure, wherein the wavelength division multiplexer reflects the optical input signal and transmits the light from the enclosed optical device, combining both as a multiplexed output signal onto an output optical signal path.

2. The package according to claim 1 wherein the wavelength division multiplexer element comprises a transparent plate with an optical coating on at least one major surface.

3. The package according to claim 1 wherein the optical device comprises a semiconductor laser.

4. The package according to claim 3 wherein the laser comprises a pump laser for doped fiber amplifiers.

5. The package according to claim 4 wherein the pump laser emits light having a wavelength selected from 980 nm and 1480 nm.

6. The package according to claim 1 wherein the assembly further includes a lens.

7. The package according to claim 6 wherein the lens is an aspheric lens.

8. The package according to claim 1 wherein the assembly further includes a holder within which the wavelength division multiplexer is mounted.

9. The package according to claim 8 wherein the holder is welded to the exterior wall of the enclosure.

10. The package according to claim 1 further comprising an optical fiber termination including a pair of optical fibers attached to the assembly so that a first fiber of said pair of optical fibers receives light from the external optical source and a second, remaining fiber of said pair of fibers transmits the multiplexed output signal from the wavelength division multiplexer.

11. The device according to claim 10 wherein the termination includes a sleeve within which the pair of optical fibers are mounted, and the sleeve is welded to a holder within which the wavelength division multiplexer is mounted.

12. A semiconductor optical device package comprising:
    a housing defining an enclosure and including an exterior wall;
    a semiconductor laser mounted within the enclosure, the laser emitting light at an assembly including a wavelength division multiplexer element adapted to reflect an incoming signal and transmit light emitted from the laser, and an aspheric lens mounted within a holder attached to the exterior wall by welding so that the multiplexer element receives light from the semiconductor laser; and
    an optical fiber termination including at least two optical fibers mounted within a sleeve which is welded to the assembly so that one fiber receives the incoming optical signal which is incident on the multiplexer element and the second fiber receives the reflected light from the multiplexer element and light emitted by the laser.

13. An optical network comprising a source of an optical signal, a doped fiber amplifier coupled to the source, a pump laser coupled to the fiber amplifier, and a wavelength division multiplexer which couples the optical signal and the pump laser to the fiber amplifier, the wavelength division multiplexer and pump laser being integrated into one package, the package comprising:
    a housing defining an enclosure and including an exterior wall;
    a semiconductor pump laser mounted within the enclosure;
    an assembly including a wavelength division multiplexer element attached to the exterior wall so that the multiplexer element receives light from the pump laser, reflects the optical signal and transmits both the optical signal and the light emitted by the pump laser; and
    an optical fiber termination including at least one optical fiber attached to the assembly so that the fiber receives light from the multiplexer element.

14. The network according to claim 13 wherein the fiber termination includes at least two optical fibers, one adapted to receive the optical signal and the other adapted to receive the reflected optical signal and the light emitted by the pump laser.

15. A method of forming a semiconductor optical package comprising:

mounting a semiconductor optical device within an enclosure including an exterior wall; and attaching an assembly including a wavelength division multiplexer to the exterior wall wherein the wavelength division multiplexer receives, along one direction, light from the mounted optical device and along an opposing direction, an optical signal from an external signal source, for combining both optical signals and forming a multiplexed optical output signal.

16. The method according to claim 15 wherein the assembly is welded to the exterior wall.

17. The method according to claim 15 further comprising:

attaching to the assembly an optical fiber termination including at least two optical fibers so that a first fiber receives the optical signal from the external signal source and a second fiber transmits the multiplexed optical output signal.

18. The method according to claim 17 wherein the termination is first aligned so that the first fiber receives light from the external signal source and the termination is attached to the assembly, and then the termination and assembly are aligned so that the second fiber receives the multiplexed optical output signal from the wavelength division multiplexer.

19. The method according to claim 17 wherein the termination is welded to the assembly.

* * * * *